United States Patent
Akiba et al.

(10) Patent No.: US 7,714,080 B2
(45) Date of Patent: May 11, 2010

(54) PRIMER COMPOSITION FOR SEMICONDUCTOR-ENCAPSULATING EPOXY RESIN MOLDING COMPOUND AND SEMICONDUCTOR DEVICE

(75) Inventors: Hideki Akiba, Gunma-ken (JP); Toshio Shiobara, Gunma-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 594 days.

(21) Appl. No.: 11/357,988

(22) Filed: Feb. 22, 2006

(65) Prior Publication Data

US 2006/0199923 A1    Sep. 7, 2006

(30) Foreign Application Priority Data

Mar. 7, 2005  (JP) .............................. 2005-062771

(51) Int. Cl.
  C08L 63/00   (2006.01)
  H01L 21/00   (2006.01)
  C08G 77/04   (2006.01)

(52) U.S. Cl. .................... 525/476; 438/118; 528/27

(58) Field of Classification Search ........... 525/476; 438/118; 528/27
See application file for complete search history.

(56) References Cited

U.S. PATENT DOCUMENTS 4,246,038 A    1/1981  Vaughn, Jr. et al.
4,480,009 A *  10/1984 Berger ...................... 428/447
5,225,484 A *  7/1993  Shiobara et al. ............. 525/101
6,372,859 B1 * 4/2002  Sakata et al. ................ 525/432
6,475,629 B1 * 11/2002 Takeuchi et al. ............ 428/450
6,506,868 B1 * 1/2003  Goda et al. .................... 528/27
6,700,185 B1 * 3/2004  Kawai et al. ................. 257/668
2004/0124544 A1 * 7/2004  Kawai et al. ................. 257/783
2006/0205891 A1 * 9/2006  Tanaka et al. ............... 525/390
2007/0277373 A1 * 12/2007 Takai et al. .................... 29/829

FOREIGN PATENT DOCUMENTS

| JP | 48-41697 B  | 12/1973 |
| JP | 52-138565 A | 11/1977 |
| JP | 54-81378 A  | 6/1979  |
| JP | 54-28430 B2 | 9/1979  |
| JP | 54-155229 A | 12/1979 |
| JP | 55-99930 A  | 7/1980  |
| JP | 5-9254 A    | 1/1993  |
| JP | 6-116517 A  | 4/1994  |

* cited by examiner

Primary Examiner—Mark Eashoo
Assistant Examiner—Megan McCulley
(74) Attorney, Agent, or Firm—Birch, Stewart, Kolasch & Birch, LLP

(57) ABSTRACT

A primer composition comprising an alkoxysilyl-containing polyamide-imide resin, an epoxy resin, a curing promoter, and an organic solvent forms a cured coating having heat resistance and water resistance through brief low-temperature heating and helps bonding of epoxy resin molding compound to semiconductor members.

3 Claims, 1 Drawing Sheet

_US 7,714,080 B2_

PRIMER COMPOSITION FOR SEMICONDUCTOR-ENCAPSULATING EPOXY RESIN MOLDING COMPOUND AND SEMICONDUCTOR DEVICE

CROSS-REFERENCE TO RELATED APPLICATION

This non-provisional application claims priority under 35 U.S.C. §119(a) on Patent Application No. 2005-062771 filed in Japan on Mar. 7, 2005, the entire contents of which are hereby incorporated by reference.

TECHNICAL FIELD

This invention relates to a primer composition for assisting in the adhesion between a semiconductor-encapsulating epoxy resin molding compound and a substrate or semiconductor chip, and an epoxy resin-encapsulated semiconductor device using the primer.

BACKGROUND ART

For the purpose of improving surface properties of molded parts made of metals or plastics, cured coatings of organosilicon compounds are often formed on the surface of molded parts, as is well known in the art. This approach, however, suffers from a problem of very poor adhesion between metals and organosilicon compounds except for the combinations of certain metals with organosilicon compounds having a limited chemical structure.

There remained a demand for adhesion promoters and primer compositions capable of improving the adhesion between them. Exemplary compositions include a primer composition based on a polyalkylene imine and an epoxy bond-containing trialkoxysilane as disclosed in JP-B 54-28430; a composition comprising a compound obtained by ester exchange of a polyester or polyether polyol with an alkoxysilane and a polyisocyanate as disclosed in JP-B 48-41697; a methyl methacrylate based composition as disclosed in JP-A 52-138565; a primer composition based on an epoxyalkyltrialkoxysilane as disclosed in JP-A 54-81378; a primer composition comprising a certain silane and an acid anhydride as disclosed in JP-A 54-155229 corresponding to U.S. Pat. No. 4,246,038; and a composition comprising a co-hydrolysate of two or more silanes and a methylol melamine alkyl ether as disclosed in JP-A 55-99930.

Unfortunately, all these compositions fail to impart fully satisfactory adhesion, hot water resistance and heat resistance to objects.

It is a common practice to encapsulate semiconductor members such as transistors, diodes, ICs and LSIs with resin materials such as epoxy resins. The encapsulation of semiconductor members with resin materials often causes the semiconductor members to be degraded by water and ionic impurities that migrate thereto from the resin materials. In one proposed solution to this problem, a semiconductor member is coated with a polyimide resin having good heat resistance, electrical properties and mechanical properties for protection, prior to the encapsulation with a resin material. In general, the polyimide resin can impart excellent properties like heat resistance to the objects. Since the polyimide resin is insoluble in solvents other than some high-boiling organic solvents, it is a common practice that the polyimide resin in a polyamic acid state as a precursor thereof is dissolved in an organic solvent, and the solution is coated onto a semiconductor member, followed by heat curing (for imidization) to form a cured coating.

In forming the polyimide resin coating by this method, however, the heat treatment for converting polyamic acid to polyimide requires a high temperature of at least 300° C. and a long time. The high temperature, long term heating involved in this method is disadvantageous from the process aspect and from the standpoint of energy saving. On the other hand, insufficient heating will allow the polyamic acid to be left in the structure of the resulting resin. The residual polyamic acid can cause to decline the moisture resistance, corrosion resistance and other properties of the polyimide resin. In particular, when the resin material is used as an insulating protective coating on semiconductor members, such decline of resin properties can cause degradation and short life to the semiconductor members, raising a serious problem. It is desired to overcome these problems.

In the current semiconductor art, packages become smaller in both size and thickness, and the surface mount technology becomes the mainstream of the component-on-substrate mounting technology. Under the circumstances, prior art epoxy resin compositions become short to maintain reliability. In addition, solders have lately been replaced by lead-free solders, which raises the solder reflow temperature up to 260° C. If packages are subjected to soldering after moisture absorption, cracks can occur in the packages or even in the absence of cracks, a substantial loss of moisture resistance can take place. From this standpoint too, there remains a need for a heat resistant primer composition of quality.

JP-A 5-009254 and JP-A 6-116517 disclose siloxane-modified polyamide-imide resins. These resins have insufficient bond strength to copper foil and still suffer from the problems including lower glass transition temperature (Tg) and degraded heat resistance of cured film.

DISCLOSURE OF THE INVENTION

An object of the present invention is to provide a primer composition which is fully adherent to metals and plastics, cures by brief low-temperature heating into a cured coating having heat resistance, water resistance and improved other properties, and thus helps bonding of semiconductor-encapsulating epoxy resin molding compound; and a semiconductor device which is encapsulated with an epoxy resin via the primer composition in the cured state.

The inventor has found that a primer composition comprising an alkoxysilyl-containing polyamide-imide resin having the general formula (1), shown below, as a base resin, preferably in combination with an epoxy resin, is adherent enough to assist in bonding of epoxy resin molding compounds to semiconductor devices and has good heat resistance and water resistance; and that a semiconductor device which is encapsulated with an epoxy resin via the primer composition remains fully reliable because neither cracking nor delamination occurs during the solder reflow step after moisture absorption.

Accordingly, the present invention provides a primer composition for bonding of semiconductor encapsulating epoxy resin molding compound, comprising an alkoxysilyl-containing polyamide-imide resin having the general formula (1) and an organic solvent as essential components.

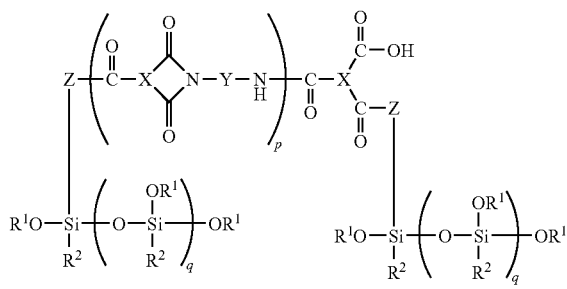

(1)

Herein X is a trivalent organic group, Y is a divalent organic group, Z is a group of the formula:

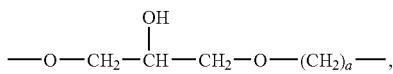

$R^1$ is $C_1$-$C_3$ alkyl, $R^2$ is $C_1$-$C_3$ alkyl or alkoxy, a is an integer of 0 to 4, p is an integer of 1 to 100, and q is an integer of 1 to 100.

Preferably, the organic solvent is present in an amount of 70 to 99.9% by weight based on the total weight of the primer composition. One preferred embodiment is a primer composition comprising (A) an alkoxysilyl-containing polyamide-imide resin having the general formula (1), (B) an epoxy resin having at least two epoxy groups in a molecule, (C) a curing promoter, and (D) an organic solvent.

Also contemplated herein is a semiconductor device which is encapsulated with an epoxy resin molding compound via the primer composition in the cured state. There is also provided a method of encapsulating a semiconductor device comprising the steps of:

applying the primer composition to the surface of a semiconductor member, curing the primer composition, and molding an epoxy resin molding compound on the outer surface of the cured primer layer.

BENEFITS OF THE INVENTION

The primer composition of the invention is fully adherent to both a semiconductor-encapsulating epoxy resin molding compound and a semiconductor member to be encapsulated therewith and cures by brief low-temperature heating into a cured film having heat resistance, water resistance and improved other properties. It thus helps bonding of semiconductor encapsulating epoxy resin molding compound to the semiconductor member.

BRIEF DESCRIPTION OF THE DRAWING

The only figure.

DESCRIPTION OF THE PREFERRED EMBODIMENTS

Figure 1:
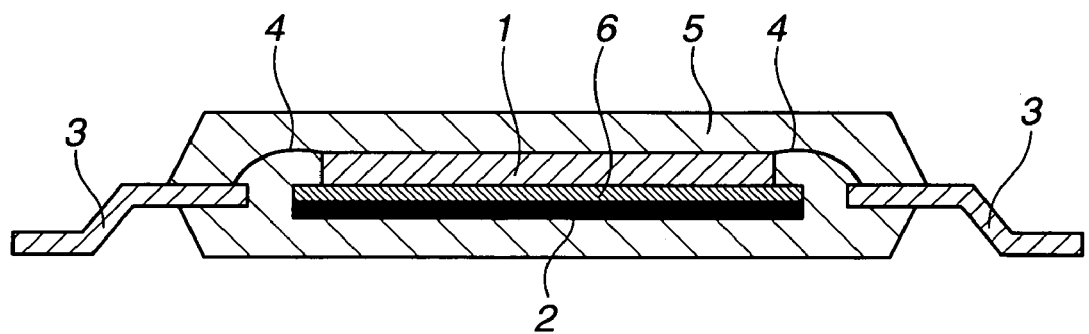
FIG. 1 is a cross-sectional view of a resin-encapsulated semiconductor device in one embodiment of the invention.

In the invention, the primer composition for bonding of semiconductor encapsulating epoxy resin molding compound comprises an alkoxysilyl-containing polyamide-imide resin having the general formula (1) as an essential component. One preferred embodiment is a primer composition comprising (A) an alkoxysilyl-containing polyamide-imide resin having the general formula (1), (B) an epoxy resin having at least two epoxy groups in a molecule, (C) a curing promoter, and (D) an organic solvent.

A) Alkoxysilyl-Containing Polyamide-Imide Resin

Component (A) is an alkoxysilyl-containing polyamide-imide resin having the general formula (1).

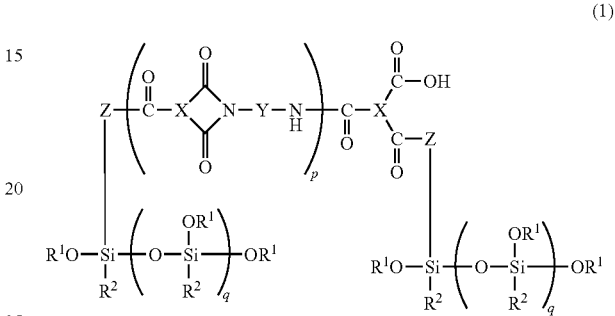

(1)

Herein X is a trivalent organic group, Y is a divalent organic group, Z is a group of the formula:

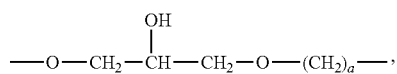

$R^1$ is $C_1$-$C_3$ alkyl, $R^2$ is $C_1$-$C_3$ alkyl or alkoxy, the subscript a is an integer of 0 to 4, p is an integer of 1 to 100, and q is an integer of 1 to 100.

The alkoxysilyl-containing polyamide-imide resin is obtained by reacting a carboxyl and/or acid anhydride group-terminated polyamide-imide resin with an epoxy group-containing alkoxysilane compound.

The polyamide-imide resins which can be used herein have amide groups and imide groups in their molecular skeleton and can be obtained, for example, by reacting tricarboxylic acids with diamines in a conventional manner. X in formula (1) is derived from the tricarboxylic acid and Y derived from the diamine.

Suitable tricarboxylic acids include trimellitic acid and trimellitic anhydride. In these cases, X has the following formula.

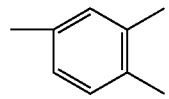

Suitable diamines includes a variety of aromatic ring-containing diamines, for example, p-phenylenediamine, m-phenylenediamine, 4,4'-diaminodiphenylmethane, 4,4'-diaminodiphenyl ether, 2,2'-bis(4-aminophenyl)propane, 4,4'-diaminodiphenylsulfone, 4,4'-diaminodiphenylsulfide, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene,
1,4-bis(p-aminophenylthioether)benzene,
1,4-bis(m-aminophenylthioether)benzene,
2,2-bis[4-(4-aminophenoxy)phenyl]propane,
2,2-bis[3-methyl-4-(4-aminophenoxy)phenyl]propane,
2,2-bis[3-chloro-4-(4-aminophenoxy)phenyl]propane,
1,1-bis[4-(4-aminophenoxy)phenyl]ethane,
1,1-bis[3-methyl-4-(4-aminophenoxy)phenyl]ethane,
1,1-bis[3-chloro-4-(4-aminophenoxy)phenyl]ethane,
1,1-bis[3,5-dimethyl-4-(4-aminophenoxy)phenyl]ethane,
bis[4-(4-aminophenoxy)phenyl]methane,
bis[3-methyl-4-(4-aminophenoxy)phenyl]methane,
bis[3-chloro-4-(4-aminophenoxy)phenyl]methane,
bis[3,5-dimethyl-4-(4-aminophenoxy)phenyl]methane,
bis[4-(4-aminophenoxy)phenyl]sulfone, and
2,2-bis[4-(4-aminophenoxy)phenyl]perfluoropropane.

Of these, preferred are p-phenylenediamine,
m-phenylenediamine, 4,4'-diaminodiphenylmethane,
4,4'-diaminodiphenylether, 1,4-bis(3-aminophenoxy)benzene,
1,4-bis(4-aminophenoxy)benzene,
2,2-bis[4-(4-aminophenoxy)phenyl]propane, and
2,2-bis[3-methyl-4-(4-aminophenoxy)phenyl]propane.

Siloxanediamines are also useful for substrate adhesion and flexibility. Accordingly, Y corresponds to the foregoing diamine with two $NH_2$ eliminated.

Illustrative, non-limiting examples of the diamine are given below.

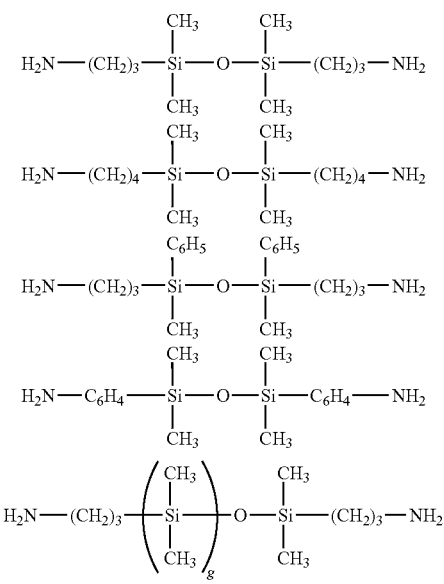

(Subscript g is an integer of 2 to 40.)

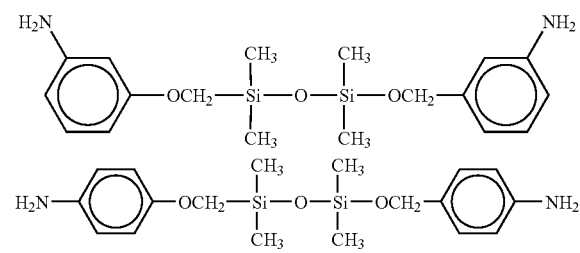

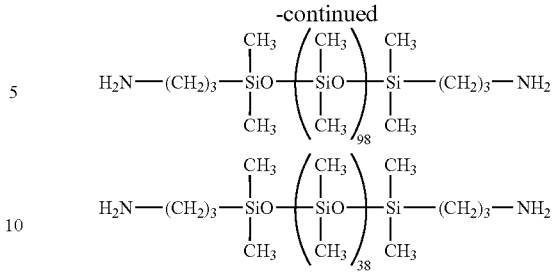

These diamines may be used alone or in combination of two or more.

Processes for the preparation of polyamide-imide resins include acid chloride process, isocyanate process and direct polymerization. The polyamide-imide resin may be prepared by any of these processes while the proportion of the reactants should be such that carboxyl groups and/or acid anhydride groups are left at molecular ends. Preferably the ratio of the moles of amino groups to the total moles of carboxyl groups and acid anhydride groups is in a range from 0.80 to 0.99, more preferably from 0.85 to 0.99.

The polyamide-imide resin should preferably have a weight average molecular weight (Mw) of about 5,000 to about 100,000, as measured by gel permeation chromatography (GPC) versus polystyrene standards. With a Mw of less than 5,000, a cured coating may lack toughness and flexibility. A resin with a Mw in excess of 100,000 has a high viscosity which may adversely affect working efficiency.

By reacting the thus obtained polyamide-imide resin with an epoxy group-containing alkoxysilane compound having the formula:

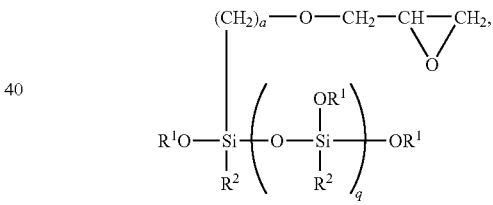

more specifically through addition reaction of epoxy groups on the epoxy group-containing alkoxysilane compound to terminal carboxyl groups and/or acid anhydride groups on the polyamide-imide resin, an alkoxysilyl-containing polyamide-imide resin having the general formula (1) can be obtained.

(1)

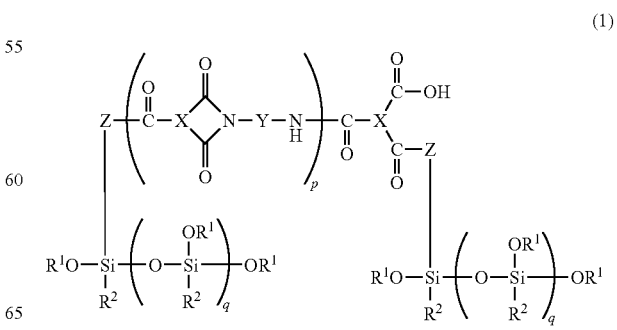

In formula (1), X, Y, Z, $R^1$, $R^2$, a, p and q are as defined above. Preferably, p and q are each independently an integer of 2 to 100, especially 3 to 80, and a is equal to 0, 1, 2 or 3.

The reaction of carboxyl and acid anhydride groups with epoxy groups may be conducted in a conventional manner. If the polyamide-imide resin has carboxyl groups left at both ends of the molecular chain, it may be reacted with at least equimolar amount of epoxy groups to the carboxyl groups. If the polyamide-imide resin has carboxyl groups left at one end and an acid anhydride group left at the other end of the molecular chain, it may be reacted with at least equimolar amount of epoxy groups to the total of carboxyl and acid anhydride groups. The reaction temperature is 30 to 130° C. and the reaction time is about 1 to about 10 hours. If desired, the reaction is conducted in a solvent such as N-methyl-2-pyrrolidone, N,N-dimethylformamide or N,N-dimethylacetamide.

Suitable alkoxysilyl-containing polyamide-imide resins are commercially available, for example, under the trade name of Compoceran H900-2, H901-2 and H901-2D from Arakawa Chemical Industries, Ltd.

B) Epoxy Resin

Any epoxy resin may be used as component (B) in the inventive composition as long as it has at least two epoxy groups in a molecule. Suitable epoxy resins include, but are not limited to, bisphenol type epoxy resins such as bisphenol F epoxy resins and bisphenol A epoxy resins; novolac type epoxy resins such as phenol novolac epoxy resins and cresol novolac epoxy resins; triphenol alkane type epoxy resins such as triphenol methane epoxy resins and triphenol propane epoxy resins; alicyclic epoxy resins, naphthalene type epoxy resins, biphenyl type epoxy resins, phenol aralkyl type epoxy resins, and biphenyl aralkyl type epoxy resins, alone or in admixture thereof. Preferred are epoxy resins of the structural formula (2):

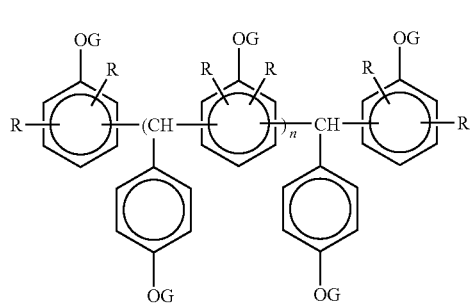

(2)

wherein G is a glycidyl group, R is hydrogen or a monovalent hydrocarbon group, at least one of all R groups is a monovalent hydrocarbon group, and n is 0 or an integer of at least 1.

The monovalent hydrocarbon groups represented by R are preferably substituted or unsubstituted monovalent hydrocarbon groups of 1 to 6 carbon atoms, more preferably 1 to 5 carbon atoms, such as alkyl and aryl groups. Typical examples include methyl, ethyl, propyl, butyl, t-butyl, and phenyl.

In formula (2), n is 0 or an integer of at least 1, preferably 0 or 1 to 10. The epoxy resin of formula (2) may be a mixture of epoxy resins having different values of n. In order that the cured product have a higher glass transition temperature, a mixture of up to 70% by weight, desirably up to 60% by weight of an epoxy resin with n=0 and the remainder of an epoxy resin or resins having a molecular weight distribution wherein an average value of n, representative of an average degree of polymerization, is in the range of 1 to 3 is preferably used. Using an epoxy resin mixture containing more than 70% by weight of an epoxy resin with n=0 may lead to a lower glass transition temperature.

Examples of the epoxy resin having the formula (2) are given below.

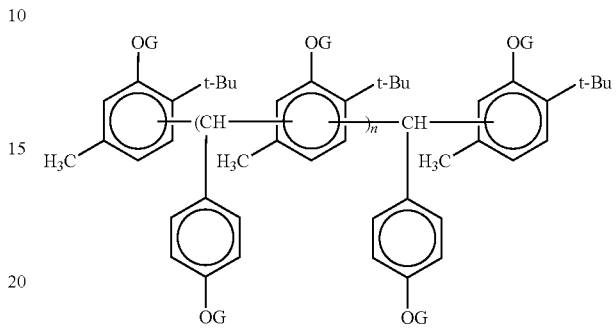

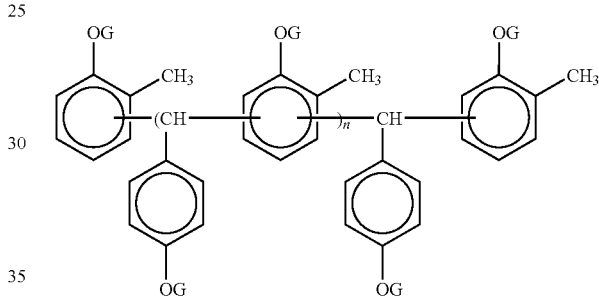

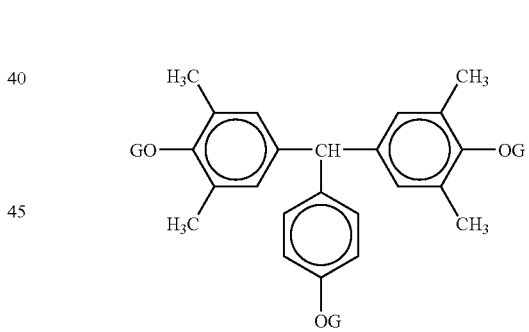

Herein, t-Bu is tert-butyl and OG is glycidoxy of the formula:

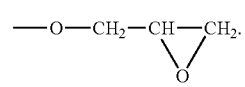

In the inventive composition, another epoxy resin may be used in combination with the epoxy resin having the formula (2). Examples of the other epoxy resin which can be used in combination include bisphenol A type epoxy resins, novolac type epoxy resins, cycloaliphatic epoxy resins, glycidyl type epoxy resins, and epoxy resins of the following formulae, alone or in any combination thereof.

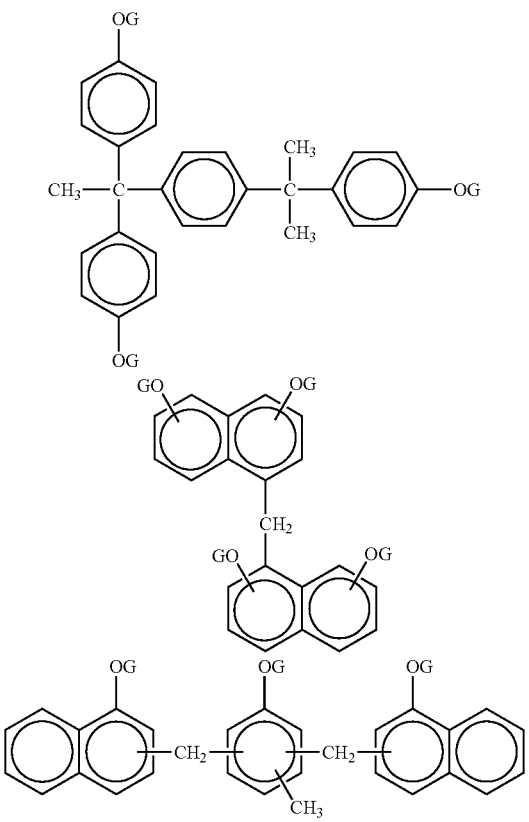

For flame retardance, brominated epoxy resins may be used. Examples of the brominated epoxy resins are given below.

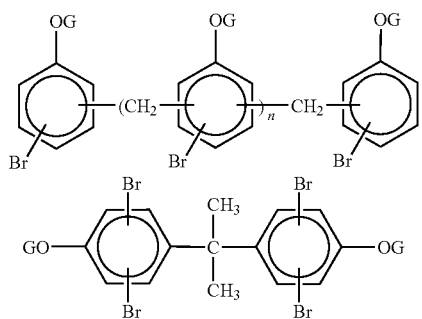

These epoxy resins may be used alone or in admixture of two or more. An appropriate amount of the epoxy resin used is usually up to 150 parts by weight (i.e., 0 to 150 parts by weight), preferably 1 to 150 parts by weight, more preferably 2 to 100 parts by weight per 100 parts by weight of the alkoxysilyl-containing polyamide-imide resin. Less than 1 pbw of the epoxy resin may fail to provide the cured coating with a bond strength to substrates whereas more than 150 pbw of the epoxy resin may degrade the heat resistance of the cured coating.

Preferably the epoxy resin of formula (2) accounts for 1 to 100% by weight, more preferably 5 to 100% by weight of the overall epoxy resins.

C) Curing Promoter

No particular limit is imposed on the curing promoter as component (C) in the inventive composition although amine catalysts are preferred for reactivity with the alkoxysilyl-containing polyamide-imide resin and epoxy resin. Suitable amine catalysts are imidazole derivatives including 2-methylimidazole, 2-ethyl-4-methylimidazole, 1-cyanoethyl-2-methylimidazole, and 2-phenyl-4,5-dihydroxymethylimidazole, which may be used alone or in admixture. Most preferred are imidazole compounds of the structural formula (3) shown below. The use of imidazole compounds of such structure may impart enhanced heat resistance, moisture resistance and adhesion to the cured product.

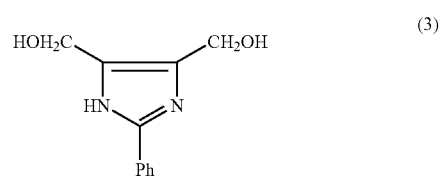

(3)

Herein Ph is a benzene ring (or phenyl group).

Other useful catalysts are phosphorus base catalysts including triphenylphosphine, triphenylphosphonium triphenylborate, and tetrapheylphosphonium tetraphenylborate, as well as compounds of the formula shown below.

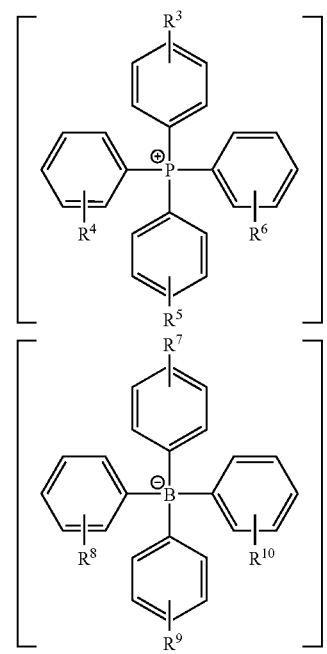

Herein, $R^3$ to $R^{10}$ are selected from hydrogen, halogen atoms (e.g., fluorine, bromine, iodine), $C_1$-$C_8$ alkyl, alkenyl, alkynyl, $C_1$-$C_8$ alkoxy, trifluoromethyl, and phenyl groups. All the substituent groups may be the same or different.

An appropriate amount of the curing promoter used is 0.001 to 20 parts by weight, preferably 0.01 to 10 parts by weight per 100 parts by weight of the alkoxysilyl-containing polyamide-imide resin and epoxy resin combined. Less than 0.001 pbw of the curing promoter may fail to achieve brief curing whereas more than 20 pbw of the curing promoter may adversely affect the shelf stability of the composition.

D) Organic Solvent

Component (D) in the inventive composition is an organic solvent in which the foregoing components are at least partially, preferably completely dissolvable. Suitable solvents include γ-butyrolactone; amide solvents such as N-methylpyrrolidone, N,N-dimethylacetamide, N,N-dimethylformamide and 1,3-dimethyl-2-imidazolidinone; ether solvents such as tetrahydrofuran, 1,4-dioxane, anisole, diglyme, triglyme, and propylene glycol monomethyl ether acetate (PGMEA); ketone solvents such as cyclopentanone and cyclohexanone; and dimethyl sulfoxide. These solvents may be used alone or in combination of two or more. Aromatic hydrocarbon solvents such as toluene and xylene and alcohols such as methanol, ethanol and propanol may be used in combination as long as solubility is not compromised. An appropriate amount of the solvent used is 70 to 99.9% by weight, preferably 75 to 99.5% by weight based on the total weight of the primer composition of the invention. The primer composition with less than 70% by weight of the solvent may be inefficient to work such as by coating. The primer composition with more than 99.9% by weight of the solvent may not form a cured coating effectively.

The primer composition of the invention is dissolved in the organic solvent, coated to either one or both surfaces of a semiconductor member and/or lead frame, and heat cured to form a coating. The coating technique may be dispensing, dipping, spraying or spin coating though not limited thereto. A cured coating or primer layer is formed preferably by heating at a temperature of up to 350° C., more preferably up to 330° C. for 30 seconds to 5 hours although the curing conditions are not critical. In order to efficiently remove the solvent in the primer composition out of the system and forward resin reactions effectively, the curing temperature is preferably raised stepwise as the case may be. Once the cured coating (primer layer) is formed, a semiconductor-encapsulating epoxy resin molding compound is molded thereover whereby the adhesion between the epoxy resin molding compound and the substrate (e.g., inorganic substrate such as Ni, Ag, Cu, Si or $SiO_2$) is enhanced. The resulting semiconductor device or package is highly reliable in that neither cracking of the epoxy resin molding compound nor delamination of the epoxy resin molding compound from the substrate (as exemplified above) occurs during the solder reflow step after moisture absorption.

The semiconductor devices to be encapsulated include, but are not limited to, diodes, transistors, thyristors, ICs, LSIs, ULSIs and the like.

Epoxy Resin Molding Compound

The epoxy resin molding compound for encapsulating the semiconductor device may be any of well-known molding compounds, and even commercially available materials. For example, KMC series epoxy molding compounds (Shin-Etsu Chemical Co., Ltd.) are useful.

The epoxy resin molding compound for semiconductor encapsulation is generally a curable epoxy resin composition comprising (a) an epoxy resin, (b) a curing agent, and (c) an inorganic filler as essential components.

The epoxy resin (a) is not particularly limited with respect to the molecular structure, molecular weight and the like as long as it has at least two epoxy groups in a molecule. Illustrative examples of suitable epoxy resins include bisphenol type epoxy resins, novolac type epoxy resins, triphenolalkane type epoxy resins, phenol aralkyl type epoxy resins, biphenyl aralkyl type epoxy resins, stilbene type epoxy resins, naphthalene ring-containing epoxy resins, biphenyl type epoxy resins, and cyclopentadiene type epoxy resins. These epoxy resins may be employed alone or in combination of two or more.

The curing agent (b) is not particularly limited with respect to the molecular structure, molecular weight and the like as long as it has at least two functional groups capable of reacting with epoxy groups on the epoxy resin (e.g., phenolic hydroxyl groups, amino groups or acid anhydride groups, in the last case, the inclusion of at least one acid anhydride group is sufficient). Suitable curing agents are phenolic resins including novolac type phenolic resins, xylylene-modified novolac resins, bisphenol type phenolic resins, biphenyl type phenolic resins, resol type phenolic resins, phenol aralkyl resins, biphenyl aralkyl resins, triphenol methane resins, triphenol alkane resins and polymers thereof, as well as naphthalene ring-containing phenolic resins and dicyclopentadiene-modified phenolic resins. Also included are acid anhydrides such as methyltetrahydrophthalic anhydride, methylhexahydrophthalic anhydride, hexahydrophthalic anhydride and Methyl-Himic Anhydride (5-norbornene-2,3-dicarboxylic anhydride), and amine base curing agents. Phenolic resins with minimal moisture absorption are preferred because of high reliability. These curing agents may be employed alone or in combination of two or more.

The amount of the curing agent (b) compounded is not particularly limited as long as it is effective for the epoxy resin to cure. When a phenolic resin is used as the curing agent, its amount is preferably such that a molar ratio of phenolic hydroxyl groups in curing agent (b) to epoxy groups in epoxy resin (a) is from 0.5 to 2.0, and especially from 0.8 to 1.5.

Examples of the inorganic filler (c) include crystalline silica, amorphous silica in spherical or fragmental form, alumina, and silicon nitride, with the amorphous silica in spherical or fragmental form being preferred because of a low coefficient of linear expansion and high fluidity. Preferably the inorganic filler has an average particle size of 1.0 to 30 μm, more preferably 5.0 to 25 μm.

An appropriate amount of the inorganic filler (c) is 250 to 1,000 parts by weight, more preferably 350 to 900 parts by weight per 100 parts by weight of the epoxy resin (a) and the curing agent (b) combined. With less than 250 pbw of the filler, the composition in the cured state may have an increased coefficient of linear expansion and will pick up more water. The composition with more than 1,000 pbw of the filler may have too low a flow to mold.

For encapsulation, the transfer molding technique is most typical. Desirably the epoxy resin composition is molded at 150 to 180° C. for about 30 to 180 seconds, and post-cured at 150 to 180° C. for about 2 to 16 hours.

EXAMPLE

Examples and Comparative Examples are given below for further illustrating the invention, but the invention is not limited thereto.

The components used in Examples are identified below.

Base Resin
  Resin A: alkoxysilyl-containing polyamide-imide resin (Compoceran H900-2, Arakawa Chemical Industries, Ltd.)
  Resin B: alkoxysilyl-containing polyamide-imide resin (Compoceran H901-2, Arakawa Chemical Industries, Ltd.)
  Resin C: polyamide-imide resin
  Resin D: polyamic acid resin Epoxy Resin

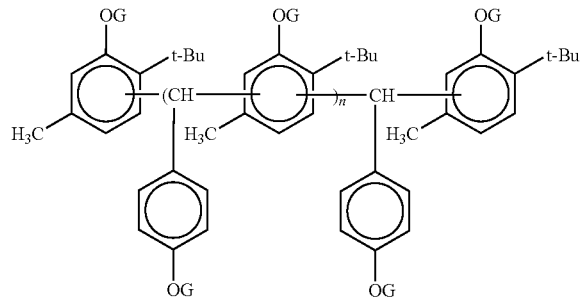

softening point: 85° C.
epoxy equivalent: 214
(n=0 59 wt %, n=1 24 wt %, n=2 8 wt %, others 8 wt %)

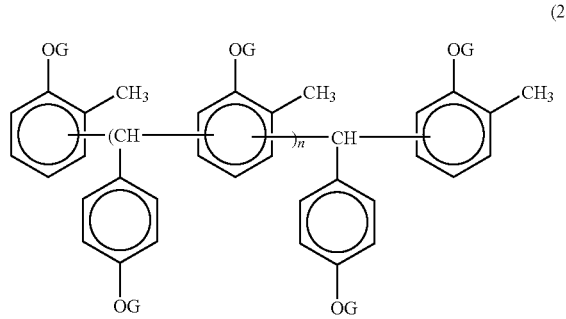

softening point: 79° C.
epoxy equivalent: 165
(n=0 54 wt %, n=1 31 wt %, n=2 9 wt %, others 6 wt %)
(3) Bisphenol A type epoxy resin,
Epikote 1001 by Japan Epoxy Resins Co., Ltd.
softening point: 64° C.
epoxy equivalent: 450
(4) Phenol novolac type epoxy resin,
EOCN-1020-55 by Nippon Kayaku Co., Ltd.
softening point: 54° C.
epoxy equivalent: 195

Catalyst
2PHZ: 2-methyl-4,5-dihydroxymethylimidazole

Organic Solvent
N-methyl-2-pyrrolidone
cyclohexanone
methoxybenzene

Examples 1-6 & Comparative Examples 1-3

Nine primer compositions were prepared by compounding the base resin with the epoxy resin, catalyst and organic solvent in accordance with the formulation shown in Table 1. The primer compositions were coated to the substrates shown in Table 1 by dipping, and cured at 200° C. for 30 minutes, following which an epoxy resin molding compound (KMC 3580CA by Shin-Etsu Chemical Co., Ltd.) was molded at 175° C. and 70 kg/cm$^2$, obtaining molded articles. Separately, the primer compositions were coated to semiconductor members and cured at 200° C. for 30 minutes, following which an epoxy resin molding compound (KMC 3580CA by Shin-Etsu Chemical Co., Ltd.) was molded at 175° C. and 70 kg/cm$^2$, obtaining molded packages (see FIG. 1). These molded samples were examined by the following tests, with the results shown in Table 1.

In FIG. 1, a cured coating 6 of primer composition intervenes between a silicon chip 1 and a die pad 2. The silicon chip 1 is connected to a lead frame 3 by bonding wires 4. The assembly is encapsulated with an epoxy resin molding compound (or encapsulant) 5 in the cured state.

(1) Adhesion After Moisture Absorption

A primer is coated and cured to a test piece (Ni, Ag, Cu or Si) shown in Table 1, following which an epoxy resin molding compound was molded at 175° C. and 70 kg/cm$^2$ for 90 seconds and post-cured at 180° C. for 4 hours, forming a cylindrical part having a bottom area of 10 mm$^2$ and a height of 3 mm. This sample was held in an atmosphere of 121° C./100% RH for 24 hours for moisture absorption, after which the peel strength between the molded part and the test piece was measured on a hot plate at 260° C. by means of a push-pull gage.

(2) Crack Resistance on Thermal Cycling

A silicon chip dimensioned 9.0 mm×4.5 mm×0.5 mm was attached to a 14-pin IC flame (42 alloy), after which a primer composition as shown in Table 1 was coated and cured. An epoxy resin molding compound was then molded at 175° C. for 90 seconds and post-cured at 180° C. for 4 hours. The resulting package was subjected to thermal cycling between −50° C./30 min and 180° C./30 min. After 1,000 cycles, a percent cracking in the epoxy resin was determined.

(3) Solder Crack Resistance After Moisture Absorption

A 60-pin QFP was used (size 20 mm×14 mm, resin thickness under die pad 0.7 mm, die pad size 10 mm×8 mm). A primer composition was coated and cured to the back surface of the die pad (see FIG. 1), following which an epoxy resin molding compound was molded at 175° C. for 90 seconds and post-cured at 180° C. for 4 hours. This package was held in an atmosphere of 85° C./85% RH for 168 hours for moisture absorption, following which it was immersed in a solder bath at 260° C. for 10 seconds. The number of cracked packages per 10 packages was determined.

TABLE 1

| Components | | Example | | | | | | Comparative Example | | |
|---|---|---|---|---|---|---|---|---|---|---|
| | (pbw) | 1 | 2 | 3 | 4 | 5 | 6 | 1 | 2 | 3 |
| Formulation | Resin A | 100 | 100 | — | 100 | 100 | — | — | — | — |
| | Resin B | — | — | 100 | — | — | 100 | — | — | — |
| | Resin C | — | — | — | — | — | — | 100 | 100 | — |
| | Resin D | — | — | — | — | — | — | — | — | 100 |
| | Epoxy resin (1) | 10 | — | 10 | — | 5 | — | — | 10 | — |
| | Epoxy resin (2) | — | 8 | — | — | — | — | — | — | — |

TABLE 1-continued

| Components (pbw) | | Example 1 | Example 2 | Example 3 | Example 4 | Example 5 | Example 6 | Comparative Example 1 | Comparative Example 2 | Comparative Example 3 |
|---|---|---|---|---|---|---|---|---|---|---|
| Epoxy resin (3) | | — | — | — | — | 5 | — | — | — | — |
| Epoxy resin (4) | | — | — | — | — | — | 10 | — | — | — |
| 2PHZ | | 1 | 1 | 1 | — | 1 | 1 | — | 1 | — |
| N-methyl-2-pyrrolidone | | 400 | 400 | 400 | 400 | 400 | 400 | 400 | 400 | 400 |
| Cyclohexanone | | 300 | 300 | 300 | 300 | 300 | 400 | 300 | 300 | 300 |
| Methoxybenzene | | 300 | 270 | 300 | 200 | 300 | 300 | 200 | 300 | 200 |
| Test results Peel strength after moisture absorption (MPa) | Nickel | 5 | 5 | 4.8 | 2.8 | 4.5 | 2.8 | 1.3 | 1.8 | 1.3 |
| | Silver | 5.1 | 5.1 | 5 | 2.5 | 3.8 | 2.8 | 0.8 | 1.5 | 0.5 |
| | Copper | 4.9 | 4.7 | 4.8 | 2.4 | 4.5 | 2.6 | 0.9 | 1.4 | 0.7 |
| | Silicon | 5.5 | 5.2 | 5.3 | 2.5 | 4 | 3 | 1.5 | 1.5 | 1.4 |
| Semiconductor package | Crack resistance on thermal cycling (% rejection) | 0 | 0 | 0 | 10 | 0 | 5 | 80 | 80 | 100 |
| | Solder crack resistance after moisture absorption | 0/10 | 0/10 | 0/10 | 1/10 | 0/10 | 1/10 | 10/10 | 9/10 | 10/10 |

Japanese Patent Application No. 2005-062771 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A primer composition for bonding of semiconductor-encapsulating epoxy resin molding compound, comprising
    (A) an alkoxysilyl-containing polyamide-imide resin having the general formula (1):

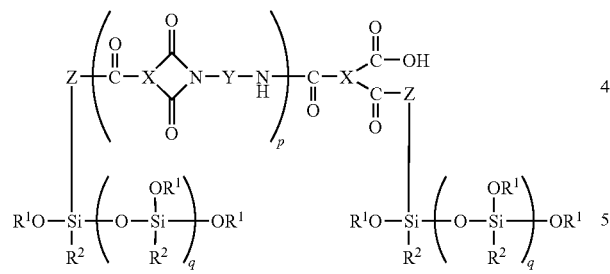

(1)

wherein X is a trivalent organic group, Y is a divalent organic group, Z is a group of the formula:

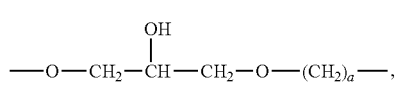

$R^1$ is $C_1$-$C_3$ alkyl, $R^2$ is $C_1$-$C_3$ alkyl or alkoxy, a is an integer of 0 to 4, p is an integer of 2 to 100, and q is an integer of 2 to 100,
    (B) an epoxy resin having at least two epoxy groups in a molecule, said epoxy resin having the general formula (2):

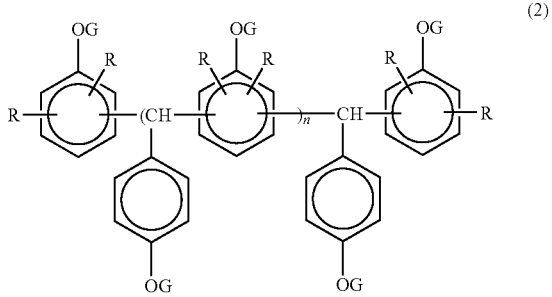

(2)

wherein G is a glycidyl group, R is hydrogen or a monovalent hydrocarbon group, at least one of all R groups is a monovalent hydrocarbon group, and n is 0 or an integer of 1 to 10, the epoxy resin being a mixture of epoxy resins having different values of n, the mixture of up to 70% by weight of the epoxy resin wherein n=0 and the remainder of the epoxy resin wherein n≠0, or epoxy resins having a molecular weight distribution wherein an average value of n, representative of an average degree of polymerization, is in the range of 1 to 3,
    (C) a curing promoter, and
    (D) an organic solvent present in an amount of 70 to 99.9% by weight based on the total weight of said primer composition.

2. A method of encapsulating a semiconductor device comprising the steps of:
    applying the primer composition of claim 1 to the surface of a semiconductor member,
    curing the primer composition, and
    molding an epoxy resin molding compound on the outer surface of the cured primer layer.

3. A semiconductor device which is coated with a primer composition comprising (A) an alkoxysilyl-containing polyamide-imide resin having the general formula (1):

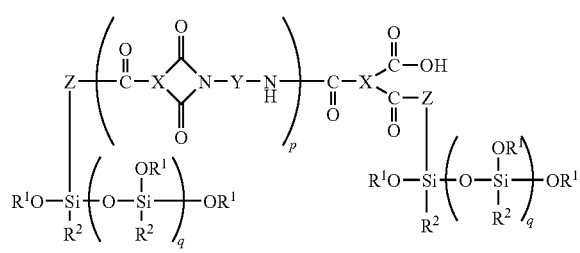

wherein X is a trivalent organic group, Y is a divalent organic group, Z is a group of the formula:

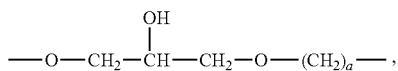

$R^1$ is $C_1$-$C_3$ alkyl, $R^2$ is $C_1$-$C_3$ alkyl or alkoxy, a is an integer of 0 to 4, p is an integer of 2 to 100, and q is an integer of 2 to 100, (B) an epoxy resin having at least two epoxy groups in a molecule, said epoxy resin having the general formula (2):

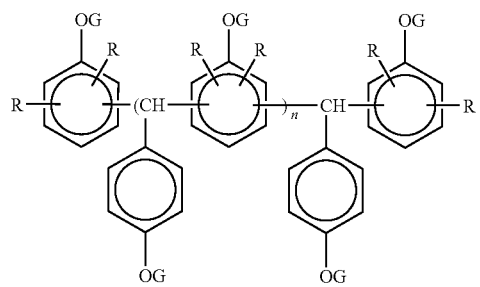

wherein G is a glycidyl group, R is hydrogen or a monovalent hydrocarbon group, at least one of all R groups is a monovalent hydrocarbon group, and n is 0 or an integer of 1 to 10, the epoxy resin being a mixture of epoxy resins having different values of n, the mixture of up to 70% by weight of the epoxy resin wherein n=0 and the remainder of the epoxy resin wherein n≠0, or epoxy resins having a molecular weight distribution wherein an average value of n, representative of an average degree of polymerization, is in the range of 1 to 3, (C) a curing promoter, and (D) an organic solvent present in an amount of 70 to 99.9% by weight based on the total weight of said primer composition, wherein said primer composition is cured to form a cured coating and wherein the coated semiconductor device is then encapsulated with an epoxy resin molding compound over the cured primer composition coating.

* * * * *